(12) United States Patent
Guo et al.

(10) Patent No.: US 6,991,987 B1
(45) Date of Patent: Jan. 31, 2006

(54) METHOD FOR PRODUCING A LOW DEFECT HOMOGENEOUS OXYNITRIDE

(75) Inventors: Xin Guo, Mountain View, CA (US); Nian Yang, San Jose, CA (US); Zhigang Wang, Santa Clara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/306,382

(22) Filed: Nov. 27, 2002

(51) Int. Cl.
H01L 21/8247 (2006.01)
(52) U.S. Cl. .................. 438/264; 438/786
(58) Field of Classification Search ........ 438/257–267, 438/786
See application file for complete search history.

(56) References Cited

U.S. PATENT DOCUMENTS

| | | | | |
|---|---|---|---|---|
| 4,654,295 A | * | 3/1987 | Yang et al. ............... | 430/314 |
| 4,698,787 A | * | 10/1987 | Mukherjee et al. ..... | 365/185.29 |
| 6,261,976 B1 | * | 7/2001 | Dong ........................ | 438/786 |
| 6,303,520 B1 | * | 10/2001 | Kwong et al. ............. | 438/769 |
| 6,410,461 B1 | * | 6/2002 | Gao et al. .................. | 438/786 |
| 2001/0044220 A1 | * | 11/2001 | Sun et al. .................. | 438/786 |
| 2002/0187651 A1 | * | 12/2002 | Reid et al. ................ | 438/774 |

* cited by examiner

*Primary Examiner*—Richard A. Booth

(57) ABSTRACT

A process technology effectuates production of low defect homogeneous oxynitride, which can be applied in tunneling dielectrics with high dielectric constants and low barrier heights for flash memory devices, and as gate oxide for ultra-thin logic devices. The process technology involves varying the oxygen content in a the homogeneous oxynitride film comprising a part of the flash memory device, which effectively increases the dielectric constant of the oxynitride film and lowers its barrier height. In one such process, a controlled co-flow of $N_2O$ is introduced into a CVD deposition process. This process effectuates production of a oxynitride film with uniform distributions of nitrogen and oxygen throughout.

17 Claims, 15 Drawing Sheets

$\Phi_{B\,Oxynitride} = \Phi_{B\,Oxide} - (1-\alpha)(\Phi_{B\,Oxide} - \Phi_{B\,oxynitride})$ $\varepsilon_{Oxynitride} = \varepsilon_{Oxide} + (1-\alpha)(\varepsilon_{Nitride} - \varepsilon_{Oxide})$ where, α is the equivalent percentage of Oxide in the Film Homogeneous Oxynitride Composition by FTIR

METHOD FOR PRODUCING A LOW DEFECT HOMOGENEOUS OXYNITRIDE

TECHNICAL FIELD

The present invention relates to the field of microelectronic integrated circuits. Specifically, the present invention relates to a method for producing a low defect homogeneous oxynitride.

BACKGROUND ART

A flash or block erase memory (flash memory), such as Flash Electrically Erasable Programmable Read-Only Memory (Flash EEPROM), includes an array of cells which can be independently programmed and read. The size of each cell and thereby the memory as a whole are made smaller by eliminating the independent nature of each of the cells. As such, all of the cells are erased together as a block.

A memory of this type includes individual Metal-Oxide Semiconductor (MOS) memory cells that are field effect transistors (FETs). Each FET, or flash, memory cell includes a source, drain, floating gate and control gate to which various voltages are applied to program the cell with a binary 1 or 0, or erase all of the cells as a block. The flash memory cell provides for nonvolatile data storage.

Prior Art FIG. 1 illustrates a typical configuration of a flash memory cell 100. The transistor typically consists of a thin, high-quality tunnel oxide layer 140 sandwiched between a conducting polysilicon floating gate 130 and a crystalline silicon semiconductor substrate 170. The tunnel oxide layer is typically composed of silicon oxide ($Si_xO_y$). The substrate 170 includes a source region 150 and a drain region 160 that can be separated by an underlying channel region. A control gate 110 is provided adjacent to the floating gate 130, and is separated by an interpoly dielectric 120. Typically, the interpoly dielectric 120 can be composed of an oxide-nitride-oxide (ONO) structure.

The flash memory cell 100 stores data by holding charge within the floating gate 130. In a write operation, charge can be placed on the floating gate 130 through hot electron injection, or Fowler-Nordheim (F-N) tunneling. In addition, F-N tunneling can be typically used for erasing the flash memory cell 100 through the removal of charge on the floating gate 130.

As flash memory technology progresses, the density of the memory cells, as well as, the speed of the flash memory increases. However, the continued reduction in size of the conventional floating gate flash memory cell 100 has been essentially limited by two primary effects: first, a minimum thickness of the tunnel oxide dielectric 140 that limits capacitance of the flash memory cell 100; and second, the inability to reduce the higher operating voltages affecting the flash memory cell 100.

First, in order to improve short channel effects and to increase core gain (Id/W), the unit area capacitance of the tunnel oxide dielectric 140 could be increased. Correspondingly, a higher unit area capacitance also leads to better retention of charge within the floating gate 130.

In the prior art, the thickness of the tunnel oxide dielectric 140 between the floating gate 130 and the substrate 170 can be reduced to obtain higher unit area capacitance. Unit area capacitance is inversely related to the thickness of the tunnel oxide dielectric 140. However, a thinner tunnel oxide dielectric 140 also leads to an increase in tunneling probability. This eventually leads to increased charge loss in the floating gate 130 over the lifetime of the flash memory device 100.

As a result, a minimum thickness of approximately 10 nanometers (nm) is necessary to negate long term reliability degradation due to increased probability of charge loss due to thinner and thinner tunnel oxide layers 140 composed of silicon oxide. Thus, unit area capacitance of the tunnel oxide dielectric 140 is limited by the minimum thickness of the tunnel oxide dielectric 140.

Second, as the flash memory cell 100 becomes smaller and smaller, a corresponding reduction in operating voltage over the flash memory cell 100 must occur in order to maintain long-term longevity of the flash memory cell 100. A reduction in physical size of the flash memory cell 100 must be accompanied by a reduction in operating voltages to maintain relatively proportional electrical fields within the flash memory cell 100. For example, subjecting the smaller flash memory device to the same operating voltages as the previously larger device would result in quicker breakdown of the device in the channel region across the source region 150 and the drain region 160.

For example, programming and erasing of the flash memory device can involve electron injection by either F-N tunneling or channel hot electron (CHE) injection. Both F-N tunneling and CHE injection are controlled by the barrier height of the tunnel oxide dielectric 140. As such, in order to reduce operating voltages, a barrier energy of the tunnel oxide dielectric 140 must be reduced.

Conventionally, the tunnel oxide dielectric 140 that is composed of silicon oxide gives a very high barrier energy. Prior Art FIG. 2 is a diagram illustrating the electron and hole barrier energies for silicon oxide tunnel oxide dielectric 140 having a dielectric constant $\xi_{oxide}$ of 3.9. As illustrated, the barrier height for electron movement is approximately 3.15 electron volts (eV). The high operating voltages required for electrons to overcome the barrier height of 3.15 eV precludes continued reduction in the size of the flash memory cell 100. In addition, the barrier height for hole movement is approximately 5.0 eV, which is prohibitively high for any hole movement under conventional operating voltages. As a result, hole movement in the prior art is not a factor in any programming or erasing scheme.

Conventional processes result in structures with such prohibitively high barrier heights, as well as less than ideal dielectric constants. For instance, oxynitrides for tunnel oxide dielectrics are produced conventionally by nitridation annealing of silicon oxide. However, oxynitrides produced by such conventional processes contain very little nitrogen. Further, the distribution of that nitrogen is far from uniform throughout the film. This relative paucity of nitrogen within oxynitride tunnel oxide dielectrics, as well as the relative heterogeneity of nitrogen distribution therein neither significantly increases the dielectric constant of the tunnel oxide dielectric, nor significantly decrease the barrier height. Conventional processes therefore are found wanting for ameliorating the problems of capacitance and barrier height.

DISCLOSURE OF THE INVENTION

A need exists for a process technology for fabricating flash memory cells that have higher unit area capacitance for better charge retention, short channel effects, and increased core gain, while enjoying the benefits of reduction in size of the flash memory cell. A need also exists for a process technology for fabricating flash memory cells that are adapted to operate under lower voltages while simultaneously reducing the size of the flash memory cell. A further need exists for a process technology for fabricating a flash memory cell that benefits from both increased dielectric constant and a reduction in the barrier energy. Further still, a need exists for a process technology for fabricating a flash memory cell that results in a homogeneous oxynitride with uniform nitrogen and oxygen distributions throughout the entire film.

The present invention provides a flash memory cell with higher unit area capacitance for better charge retention, short channel effects, and increased core gain, along with a reduction in size of the flash memory cell. Also, the present invention provides for a flash memory cell adapted to operate under lower voltages necessary for operation with a reduction in size of the flash memory cell.

Specifically, one embodiment of the present invention discloses a flash memory cell that comprises a tunnel oxide dielectric layer comprised of homogeneous oxynitride. The tunnel oxide dielectric layer separates a floating gate from a channel region that is formed between a source region and a drain region in a substrate. The flash memory cell further comprises a dielectric layer, such as an oxide-nitride-oxide (ONO) layer, that separates a control gate from the floating gate.

By varying the oxygen and nitrogen content in the homogeneous oxynitride, the flash memory cell can benefit from an increase in the dielectric constant, which leads to higher unit area capacitance for better charge retention in the floating gate. Also, the use of homogeneous oxynitride leads to lowered barrier heights in the tunnel oxide dielectric layer which can allow for reduced operating voltages.

The homogeneity of the oxynitride is due to the uniform distribution of nitride within the tunnel oxide dielectric layer between the channel region and the floating gate. In one embodiment, the homogenous oxynitride is a defect free silicon nitride.

Moreover, homogenous oxynitride is associated with lowered hole barrier height which enables a more efficient erasure scheme. For example, with silicon nitride, the hole barrier height can be reduced to 3.5 eV, from the 5.0 eV associated with Fowler-Nordheim (F-N) tunneling, thereby supporting source-side channel hot hole injection (SSCHHI) erasing in the flash memory cell. The SSCHHI erasing scheme can be implemented at much lower voltages than the F-N erasing scheme.

A process technology effectuates fabrication of flash memory devices enjoying the advantages mentioned above. In one embodiment, the process involves varying the oxygen content in a the homogeneous oxynitride film comprising a part of the flash memory device, which effectively increases the dielectric constant of the oxynitride film and lowers its barrier height.

In one embodiment, a controlled co-flow of nitrogen oxide ($N_2O$) is introduced into a chemical vapor deposition (CVD) nitride deposition process. The present embodiment effectuates production of a oxynitride film with uniform distributions of nitrogen and oxygen throughout. Advantageously, this process results in a homogeneous oxynitride in which the benefits of increased dielectric constant and lowered barrier height are realized.

BRIEF DESCRIPTION OF THE DRAWINGS

PRIOR ART

PRIOR ART

DETAILED DESCRIPTION OF THE INVENTION

Reference will now be made in detail to embodiments of the present invention, a method for producing a low defect homogeneous oxynitride. The low defect can be used as a tunneling dielectric, such as for advanced flash memory devices. Such flash memory devices include memory cells having a tunnel oxide dielectric composed of homogeneous oxynitride. It can also be used as a gate oxide for ultra-thin gate logic devices.

While the invention will be described in conjunction with these embodiments, it will be understood that the description and discussions thereof are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, the present invention discloses a method for producing a defect-free homogeneous oxynitride tunneling dielectric for advanced flash memory devices. An embodiment of the present invention effectuates the fabrication of a flash memory cell with higher unit area capacitance for better charge retention, short channel effects, and increased core gain, along with a reduction in size of the flash memory cell. In one embodiment, the present invention discloses a flash memory cell adapted to operate under lower voltages necessary for operation with a reduction in size of the flash memory cell.

Figure 3:
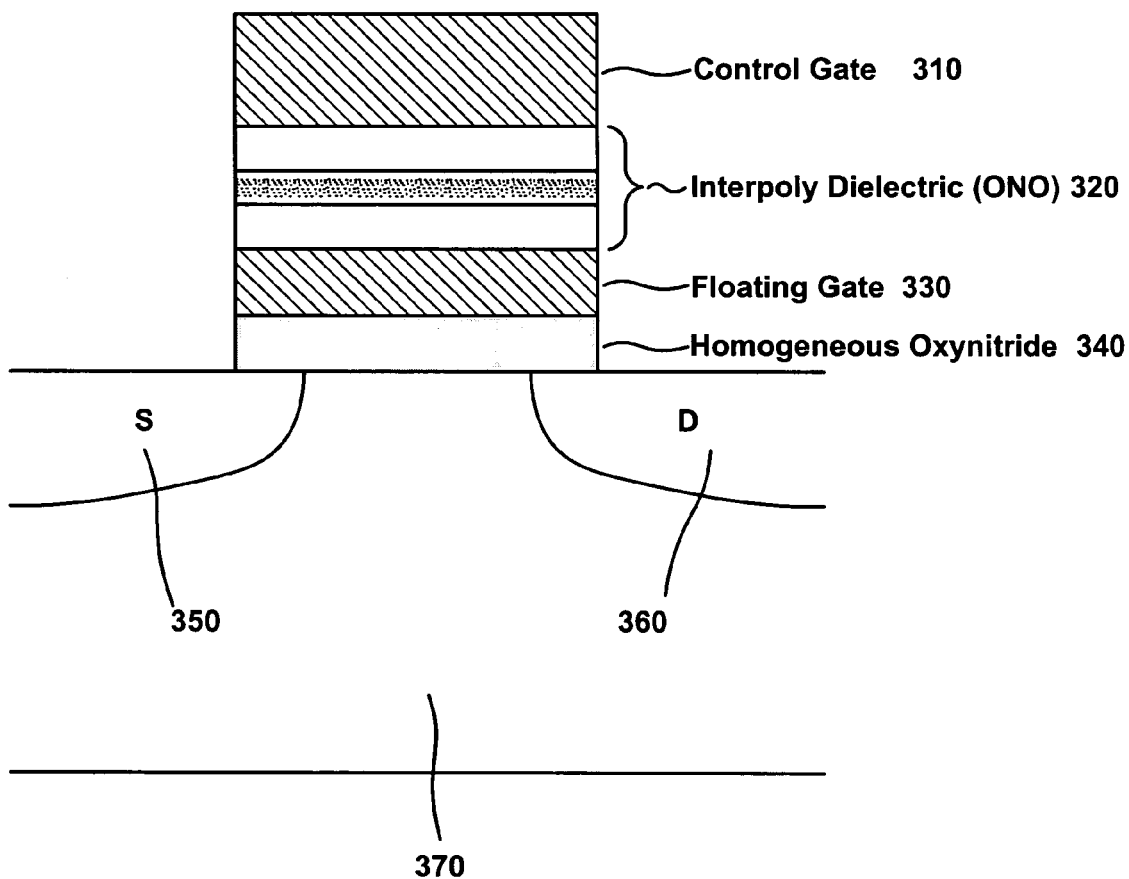
FIG. 3 is a cross sectional view of a semiconductor flash memory cell including a tunnel oxide dielectric composed of homogenous oxynitride, in accordance with one embodiment of the present invention.

Embodiments of the present invention disclose a flash memory cell including a tunnel oxide dielectric composed of homogeneous oxynitride. FIG. 3 is a cross-sectional diagram of flash memory cell 300 including a tunnel oxide dielectric 340 essentially composed of homogeneous oxynitride. The tunnel oxide dielectric 340 is sandwiched between a conducting polysilicon floating gate 330 and a crystalline silicon semiconductor substrate 370. The substrate 370 includes a source region 350 and a drain region 360 that can be separated by an underlying channel region. A control gate 310 is provided adjacent to the floating gate 330, and is separated by an interpoly dielectric 320. Typically, the interpoly dielectric 320 can be composed of an oxide-nitride-oxide (ONO) structure.

The flash memory cell 300 can be adapted to form a p-channel flash memory cell or an n-channel flash memory cell depending on user preference, in accordance with embodiments of the present invention. In either case, the tunnel oxide dielectric 340 and its function remains essentially unchanged with the homogeneous oxynitride composition. Embodiments of the present inventions are well suited to implementation within a p-channel or n-channel flash memory cell.

Figure 4:
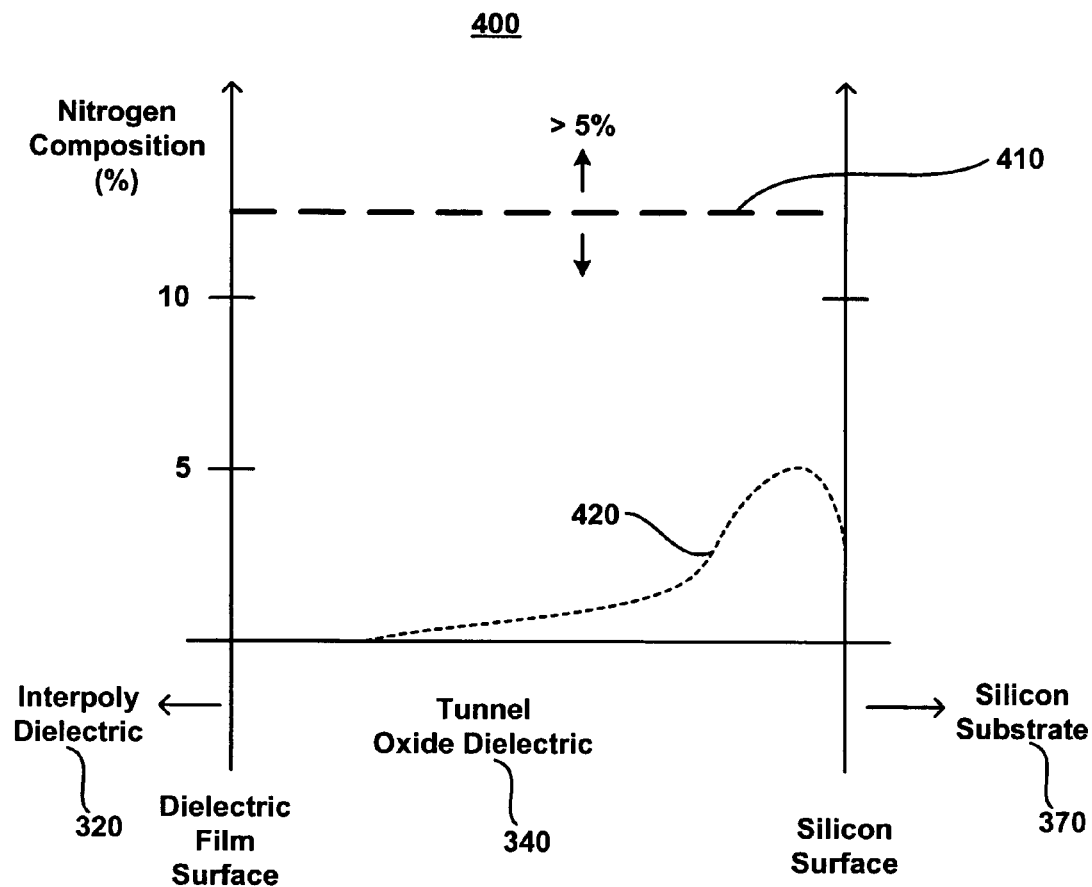
FIG. 4 is a diagram illustrating the uniform distribution of nitrogen in a homogeneous oxynitride composition for a tunnel oxide dielectric, in accordance with on embodiment of the present in invention.

The homogeneous nature of the oxynitride composition for the tunnel oxide dielectric 340 is shown in diagram 400 of FIG. 4, in accordance with one embodiment of the present invention. Along the vertical axis of diagram 400, the nitrogen composition is charted as a percentage within the tunnel oxide dielectric 340. The horizontal axis provides distance and location information for the interpoly dielectric 320, the tunnel oxide dielectric 340 and the silicon substrate 370. A dielectric film surface separates the interpoly dielectric 320 from the tunnel oxide dielectric 340. A silicon surface separates the silicon substrate 370 from the tunnel oxide dielectric 340.

FIG. 4 also graphically depicts a comparison of nitrogen distribution between conventional oxynitride and homogeneous oxynitride compositions of the tunnel oxide dielectric 340. Dotted line 420 illustrates the distribution of nitrogen for conventional forms of oxynitride. Line 420 exhibits the non-uniform distribution of nitrogen throughout the tunnel oxide dielectric 420. Moreover, line 420 does not exceed five percent for nitrogen composition in the prior art. As a result, most of the tunnel oxide dielectric 340 is of a silicon oxide composition.

Line 410 of FIG. 4 illustrates the uniform distribution of nitrogen in a homogenous oxynitride composition for the tunnel oxide dielectric 340. As such, nitrogen is evenly distributed throughout the tunnel oxide dielectric 340. In one embodiment, the amount of nitrogen ranges between 5 to 100 percent within the tunnel oxide dielectric 340.

The homogeneous oxynitride is formed in one embodiment by boosting pure oxide with nitrogen in a nitridation process using ammonium ($NH_3$) or nitrogen oxide $N_2O$. In a second embodiment, the homogenous oxynitride is formed by oxidizing pure nitride with oxygen ($O_2$) or nitrogen oxide ($N_2O$).

Charge retention in the flash memory cell 300 is proportional to unit area capacitance. As such, a higher unit area capacitance leads to better retention of charge, and more particularly, to improved short channel effects and increased core gain (Id/W). The following equation (1) illustrates the relationship of unit area capacitance to characteristics of the flash memory cell 300.

$$\text{Capacitance} = \frac{\xi_o \xi_{oxide}}{\text{Thickness}_{tunnel\ oxide}} \quad (1)$$

where $\xi_o$ is the dielectric constant of a vacuum, and $\xi_{oxide}$ is the dielectric constant of the tunnel oxide dielectric 340. The tunnel oxide thickness is limited to a minimum thickness in order to maintain charge retention. Tunnel oxide dielectric layers thinner than the minimum thickness can lead to unwanted tunneling effects resulting in loss of charge. As a result, reducing the thickness of the tunnel oxide dielectric in order to increase capacitance is limited by the minimum thickness.

However, increasing the value of $\xi_{oxide}$ will increase the capacitance of the tunnel oxide dielectric 340. In one embodiment, the homogeneous oxynitride composition in the tunnel oxide dielectric 340 shows a substantial increase over the $\xi_{oxide}$ value of the silicon oxide in conventional flash memory cells (e.g., cell 100). As such, the unit area capacitance of the tunnel oxide dielectric 340 is also increased, while maintaining the thickness (e.g., the minimum thickness) of the dielectric 340 for increased charge retention, and more particularly, for improved short channel effects and increased core gain.

Also, the increase in the unit area capacitance may offset the loss of charge due to thinness of the tunnel oxide dielectric 340. As such, one embodiment of the present invention is able to reduce the thickness of the tunnel oxide dielectric beyond the minimum thickness, since charge retention is unaffected due to an increase in unit area capacitance due to the increased unit area capacitance.

Figure 1:
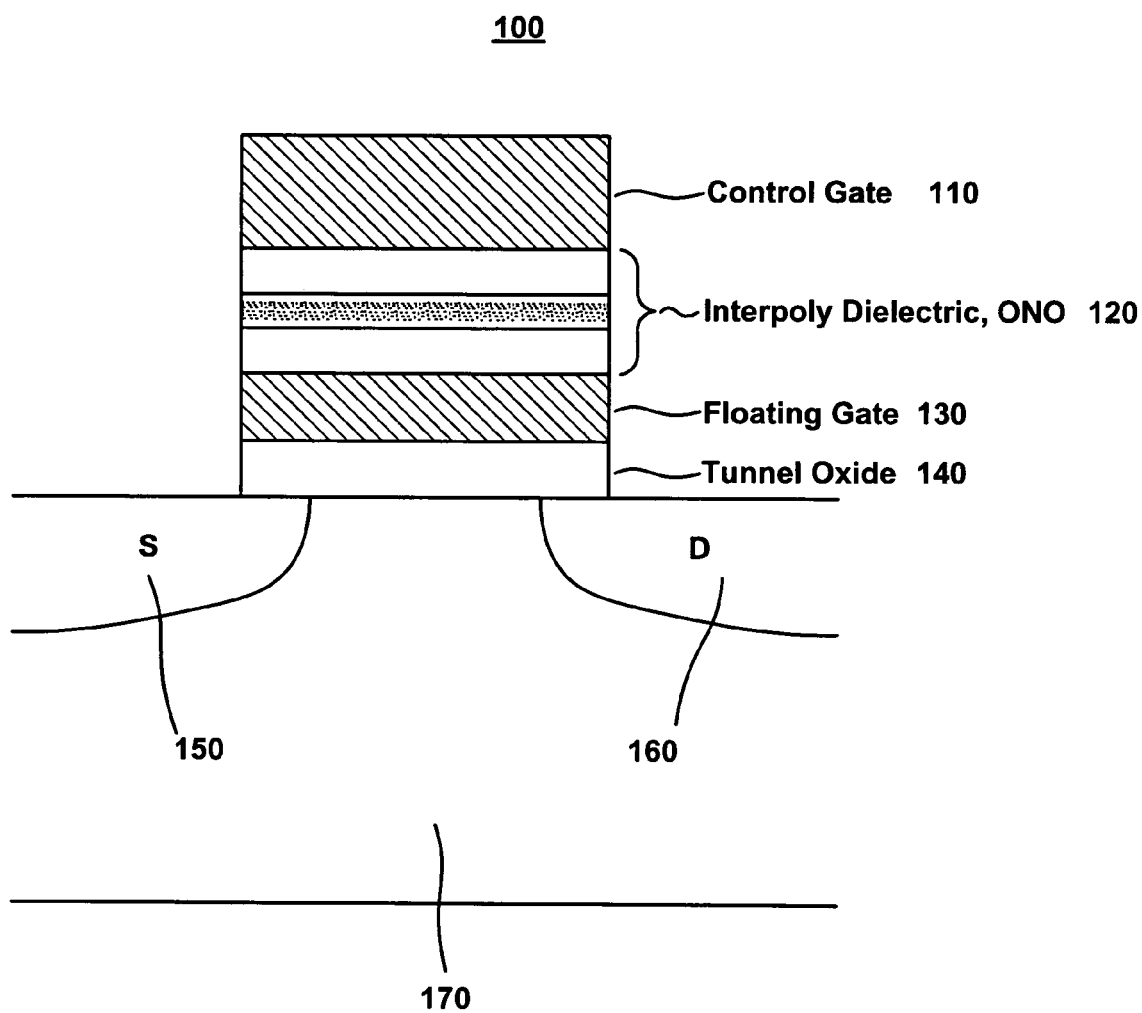
FIG. 1 is a cross sectional view of a semiconductor flash memory cell.
Figure 2:
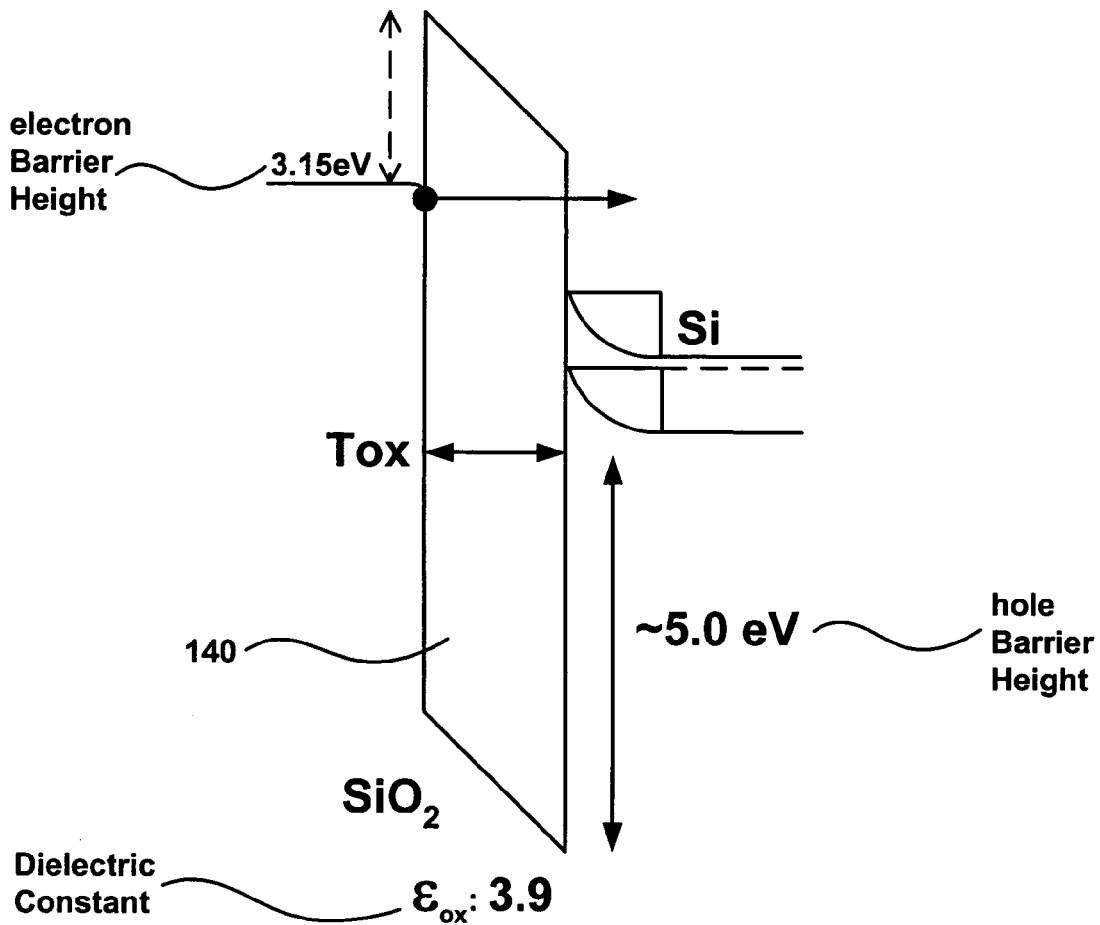
FIG. 2 is an energy band diagram associated with a tunnel oxide dielectric composed of silicon oxide of the semiconductor flash memory cell of Prior Art FIG. 1.
Figure 5:
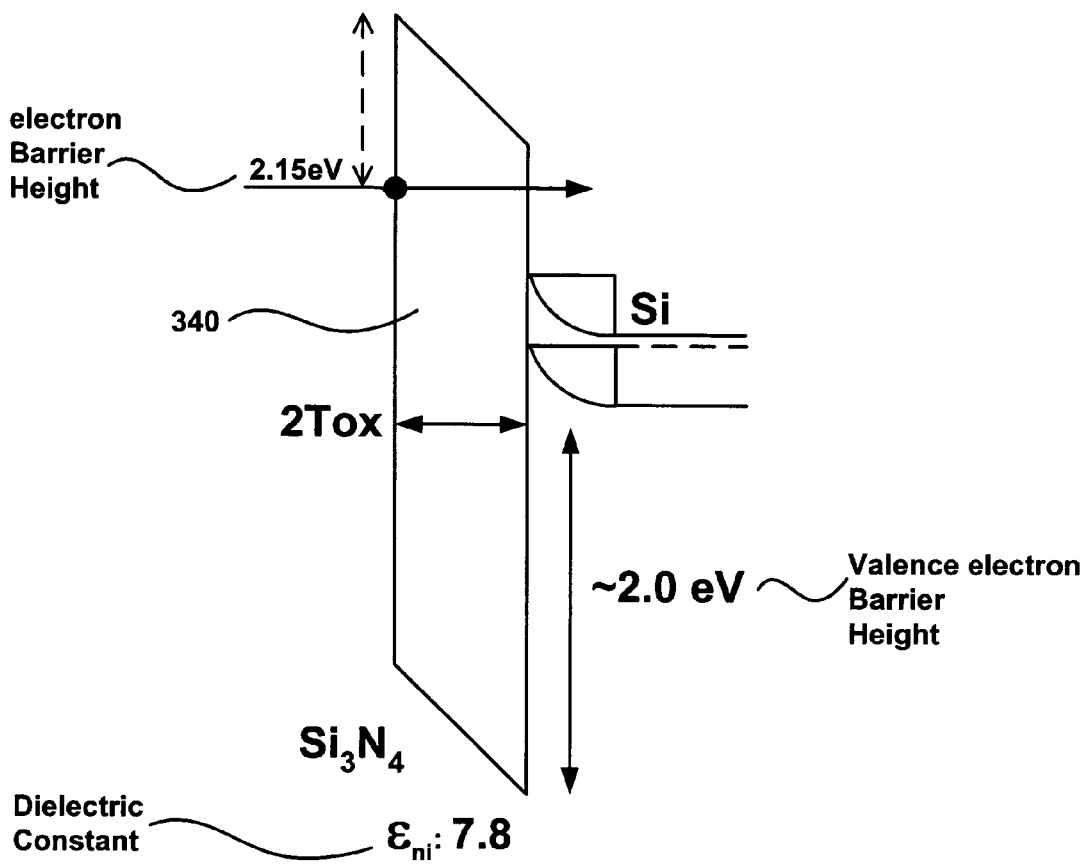
FIG. 5 is an energy band diagram associated with a tunnel oxide dielectric composed of homogeneous oxynitride, in accordance with one embodiment of the present invention.

In one embodiment, the homogeneous oxynitride is comprised of defect free silicon nitride ($Si_xN_y$). In particular, a silicon nitride composition of $Si_3N_4$ is used in one embodiment as the tunnel oxide dielectric 340. FIG. 5 illustrates an energy band diagram for the silicon nitride composition ($Si_3N_4$) of the tunnel oxide dielectric 340. As shown in FIG. 5, the oxide value of $Si_3N_4$ is 7.8, which is substantially higher than the $\xi_{oxide}$ value of 3.9 for the silicon oxide in the prior art, as previously shown in Prior Art FIG. 2. As a result, by using homogeneous oxynitride, the unit area capacitance of the tunnel oxide dielectric 340 can be increased.

In addition, the programming and erasing of the flash memory cell 300 involves, in part, electron injection through the tunnel oxide dielectric 340. The electron injection occurring through either Fowler-Nordheim (F-N) tunneling or channel hot electron (CHE) injection is dominated by the barrier height of the tunnel oxide dielectric 340. By using the homogeneous oxynitride, the operating voltages of the flash memory cell 300 can be reduced due to the lowered barrier height of the tunnel oxide dielectric 340 over conventional silicon oxide dielectric.

Figure 6A:
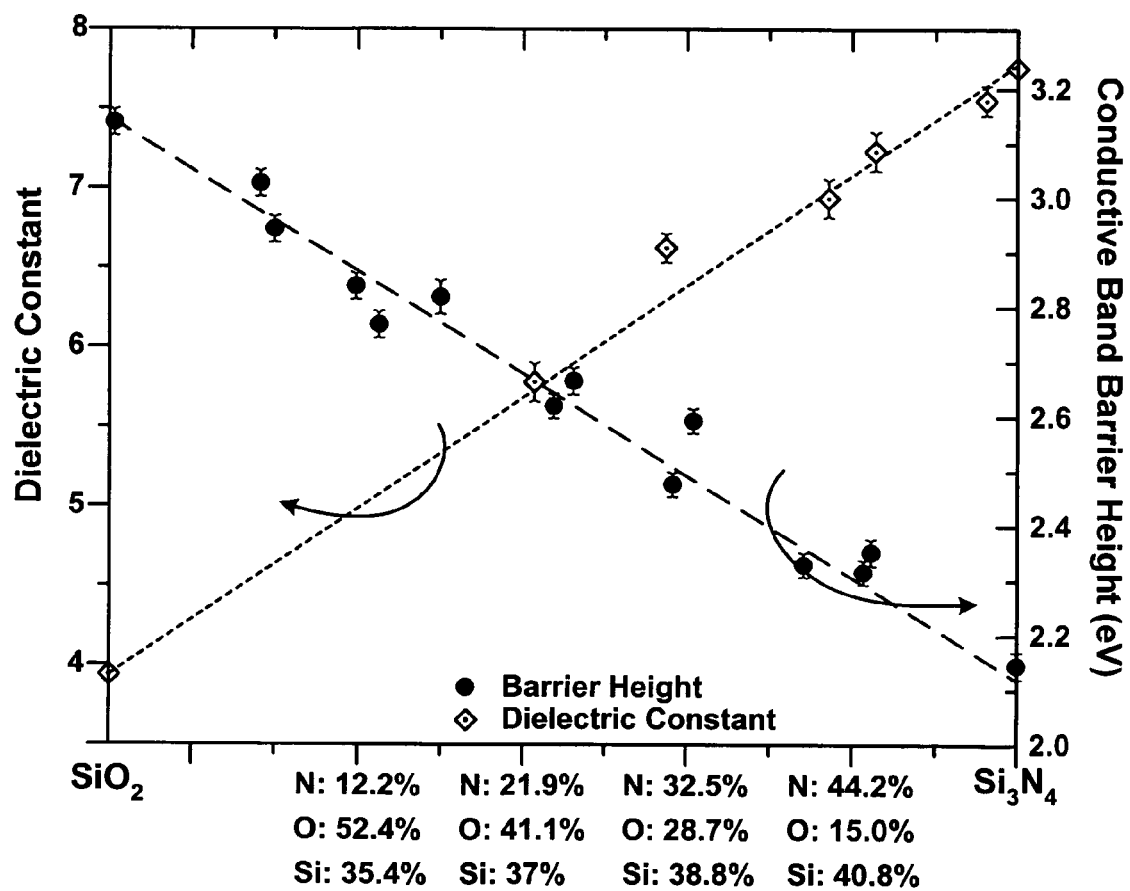
FIG. 6A is a diagram illustrating barrier heights and dielectric constants for a tunnel oxide dielectric with varying concentrations of oxygen within a homogeneous oxynitride composition, in accordance with one embodiment of the present invention.

FIG. 6A is a diagram 600A illustrating the variation of dielectric constant and conduction band barrier heights for varying concentrations of oxygen and nitrogen within the homogeneous oxynitride composition of the tunnel oxide dielectric 340 in a flash memory cell 300, in accordance with one embodiment of the present invention. As shown in diagram 600A, by varying the oxygen content in the homogeneous oxynitride, the flash memory cell can benefit from both increased dielectric constant, and lowered barrier height.

Looking further at FIG. 6A, by varying the nitrogen or oxygen content of the homogeneous oxynitride, the physical characteristics in the tunnel oxide dielectric 340 can be manipulated. For example, the dielectric constant can be increased over a range from approximately 3.9 to approximately 7.8. Also, the barrier height can be decreased over a range from approximately 3.2 eV to approximately 2.1 eV.

For example, if a homogeneous oxynitride with the equivalent of fifty percent oxide composition is used, the dielectric constant of the material will be 5.85. This allows a flash memory cell 300 to maintain the same physical thickness for the tunnel dielectric without any reduction in the charge loss characteristic. In addition, the use of homogeneous oxynitride with increased dielectric can achieve a fifty percent higher unit area capacitance for improving both short channel effect and core gain.

Figure 6B:
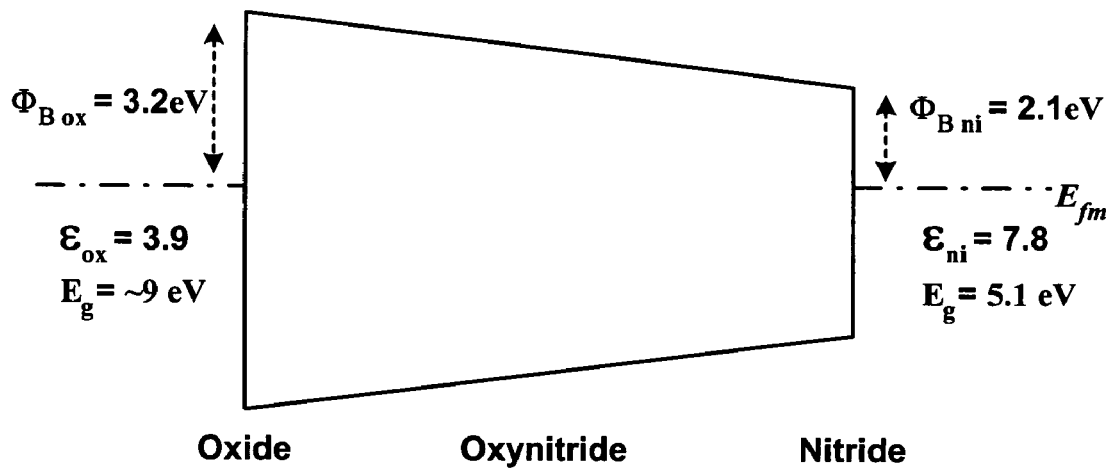
FIG. 6B is a diagram illustrating barrier heights and dielectric constants for a tunnel oxide dielectric composed of homogeneous oxynitride, in accordance with one embodiment of the present invention.

FIG. 6B is a diagram 600B illustrating the variation of dielectric constant and conduction band barrier heights for an oxynitride dielectric moving towards a pure nitride composition for the tunnel oxide dielectric 340, in accordance with one embodiment of the present invention. As shown in diagram 600B, a pure nitride composition for the tunnel oxide dielectric achieves a dielectric of 7.8 and a barrier height of 2.1 eV. In addition, the total energy gap ($E_g$) for both the electron conduction band and the valance electron conduction band is reduced to 5.1 eV.

A benefit of lowered operating voltages can result from lowering the barrier height by using a homogeneous oxynitride composition for the tunnel oxide dielectric 340. In the previously mentioned example with a fifty percent oxide composition in the homogeneous oxynitride, the electron barrier height is 2.6 eV. As a result, the programming drain voltage can be scaled down by at least 0.5 V from current devices without suffering loss of programming efficiency. Low power and low Vcc flash memory design can significantly benefit from this voltage reduction. The lower electron barrier height can also improve F-N erase efficiency, and improve device write speed.

Figure 7:
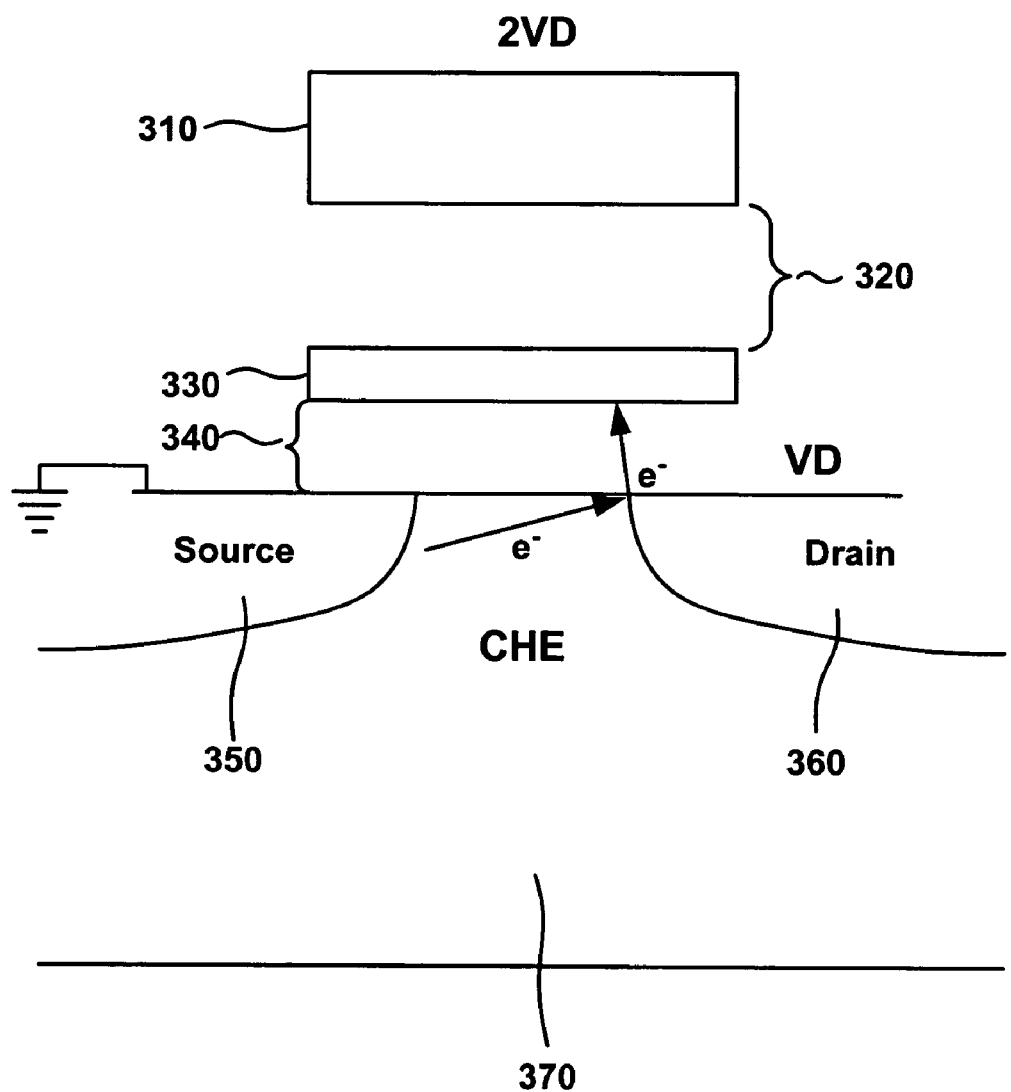
FIG. 7 is a block diagram illustrating a Fowler-Nordheim (F-N) channel hot electron (CHE) programming scheme for a tunnel oxide dielectric composed of homogeneous oxynitride, in accordance with one embodiment of the present invention.

FIG. 7 illustrates a programming state for the flash memory cell 300 of FIG. 3 including a tunnel oxide dielectric 340 comprised of homogeneous oxynitride. To program or write to the flash memory cell 300, a voltage VD of 3 to 4 volts is applied to the drain 360. This is in contrast to voltages of 4 to 5 volts applied to the drain for conventional flash memory devices including tunnel oxide dielectrics comprised of silicon oxide. In addition, a voltage of approximately 2VD (6 to 8 volts) is applied to the control gate 310. This is in contrast to voltages of 8 to 10 volts applied to the drain from conventional flash memory devices.

Since the source 350 is coupled to ground, the flash memory cell 300 is activated and current flows from the source 350 to the drain 360. As electrons are accelerated through the channel region between the source 350 and the drain 360, impact ionization of silicon atoms in the drain 360 creates electrons and valence electrons. The electrons are attracted towards the floating gate 330 by the voltage 2VD applied at the control gate 310. The valence electrons dissipate into the substrate 370.

Figure 8A:
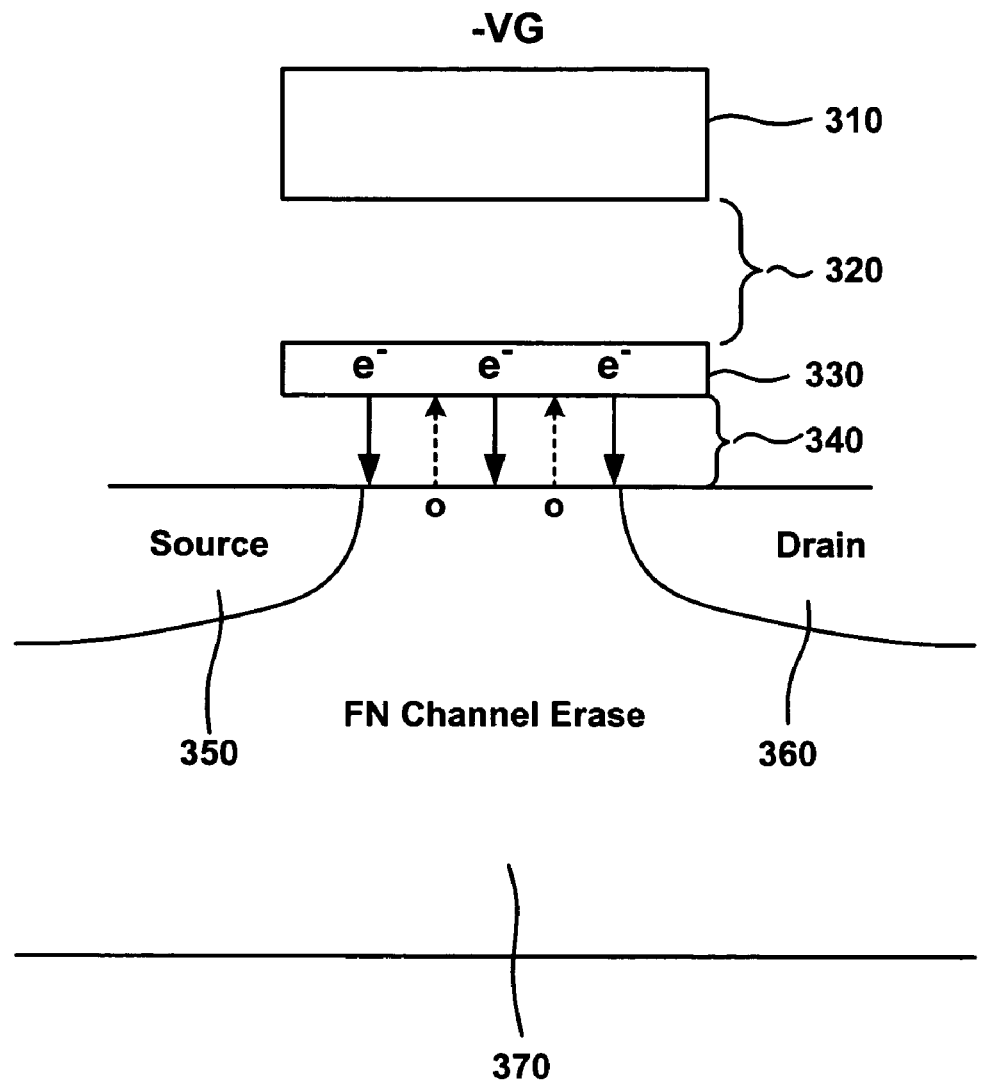
FIG. 8A is a block diagram illustrating a F-N channel erasing scheme for a tunnel oxide dielectric composed of homogeneous oxynitride, in accordance with one embodiment of the present invention.

By using homogeneous oxynitride in the tunnel oxide dielectric 340, lower operating voltages can be applied during erasing schemes using F-N tunneling, in accordance with one embodiment of the present invention. FIG. 8A is a block diagram illustrating an F—N tunneling erasing scheme as applied to a flash memory device 300, as previously introduced in FIG. 3. A high negative voltage is necessary to move electrons out from the floating gate 330. Also, the source 350 and 360 are floating during the erase. By using the homogeneous oxynitride in the tunnel oxide dielectric 340, an effective negative bias of approximately −16 volts (e.g., −VG=−16 volts, and ground coupled to the substrate) across the flash memory cell 300 will provide for erasure, while floating the source 350 and the drain 360. In comparison, a −VG of −18 volts is needed to erase conventional flash memory cells by pushing electrons out from the floating gate 330.

In addition, by virtue of the lower electron and valence electron barrier heights, both electron and valence electron movement contribute to the erasure of the flash memory cell 300. As shown in FIG. 8A, electrons tunnel across the tunnel oxide dielectric 340 from the floating gate 330 to the substrate 370. Simultaneously, valence electrons move across the tunnel oxide dielectric 340 from the substrate 370 to the floating gate 330. As such, the erase time for flash memory cell 300 using homogeneous oxynitride is significantly faster than the conventional flash memory cells using silicon oxide for the tunnel oxide dielectric.

Figure 8B:
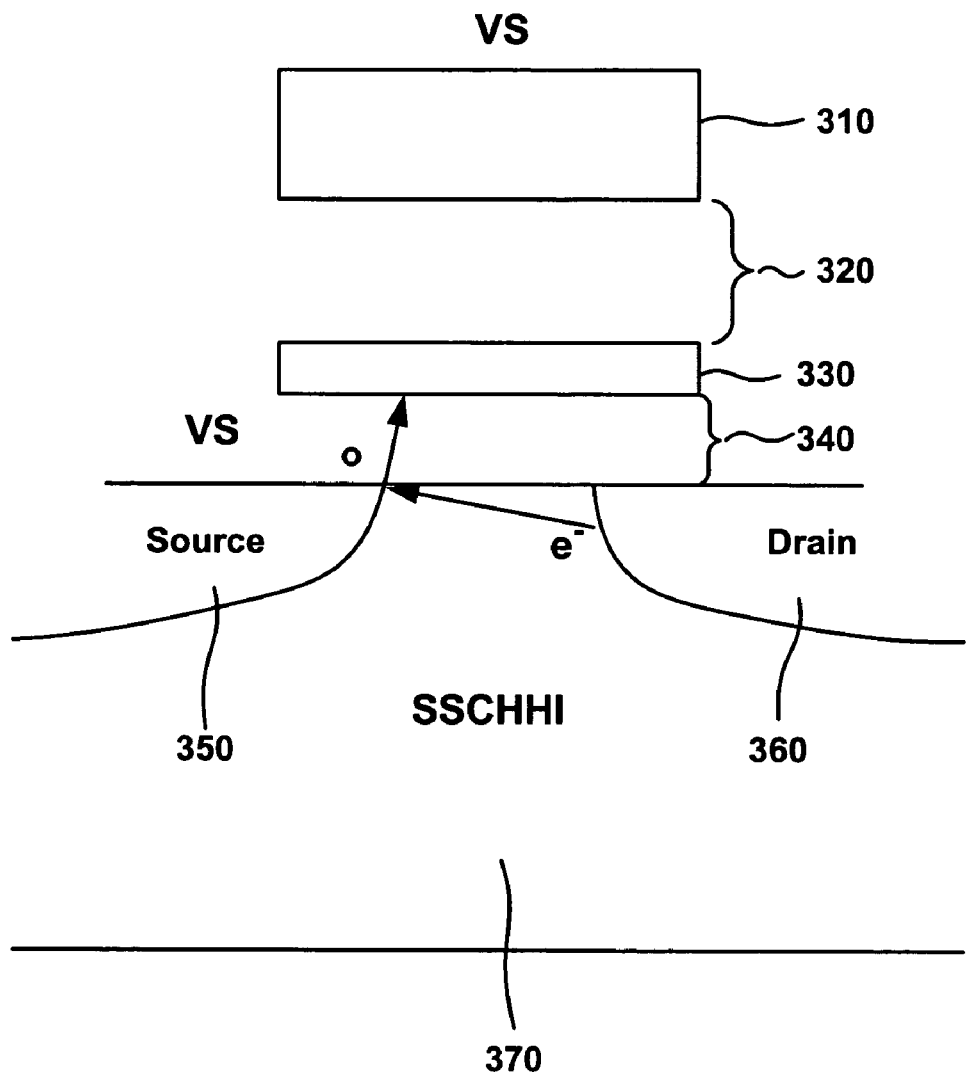
FIG. 8B is a block diagram illustrating a source side channel hot hole injection (SSCHHI) erasing scheme for a tunnel oxide dielectric composed of homogeneous oxynitride, in accordance with one embodiment of the present invention.

Moreover, the lower valence barrier height can enable a more efficient erasure scheme, source-side channel hot hole injection (SSCHHI) erase that can be implemented with the lowered operating voltages consistent with the lower electron and valance barrier height of the oxynitride tunnel oxide dielectric. FIG. 8B is a block diagram illustrating a SSCHHI erasing scheme as applied to a flash memory device 300, as previously introduced in FIG. 3. The drain 360 is grounded. The source voltage (VS) can cover a range of approximately 3 to 5 volts. The voltage applied to the gate is similar to VS and covers a range of approximately 3 to 5 volts.

Since the drain 360 is coupled to ground, an electric field is generated across the channel region between the source 350 and the drain 360, pulling electrons from the drain 360 to the source 350. As such, current flows into the source from the drain 360. As electrons are accelerated through the channel region between the source 350 and the drain 360, impact ionization of silicon atoms in the source 350 creates electrons and valence electrons. Since the control gate is negatively biased, the valance electrons (holes) are attracted towards the floating gate 330 by the voltage VS applied at the control gate 310, and neutralize the electrons stored in the floating gate 330. Conversely, the electrons are dissipated in the substrate 370.

Operating voltages can be reduced using flash memory cells including tunnel oxide dielectrics with homogeneous oxynitride. For the previously mentioned example using a fifty percent oxide composition in the homogeneous oxynitride, the valence electron barrier height is reduced to 3.5 eV from 5.0 eV allowing for better electron and valence electron movement for erasing.

For example, in one particular embodiment, a voltage of 4 volts is applied to the source 350 of FIG. 8B. A voltage of 4 volts is also applied to the control gate 310. The voltage seen at the floating gate 300 is determined by a coupling ration (e.g., 0.6) and is approximately 2.4 volts. As a result the voltage needed by the flash memory cell 300 for to perform a SSCHHI erase is between 0 to 5 volts. This is a significant improvement over the 18 volts power supply needed to perform a CHE erase in conventional flash memory cells.

In addition, an added benefit of improving device cycling endurance is realized by performing SSCHHI erasing. Doing the SSCHHI erase at the source side de-couples or separates the zone of ionization impact. This extends the longevity of the flash memory cell by spreading the deleterious impact of electron ionization impact to both the source and the drain, instead of concentrating the ionization impact to just the drain region.

In another embodiment, the lower valence barrier height can enable a more efficient erasure scheme, drain-side channel hot hole injection (DSCHHI) erase that can be implemented with the lowered operating voltages consistent with the lower electron and valance barrier height of the oxynitride tunnel oxide dielectric. The CHHI erase that is carried out on the drain side can simplify circuit design without introducing new reliability issues because it is a low energy process.

Figure 9:
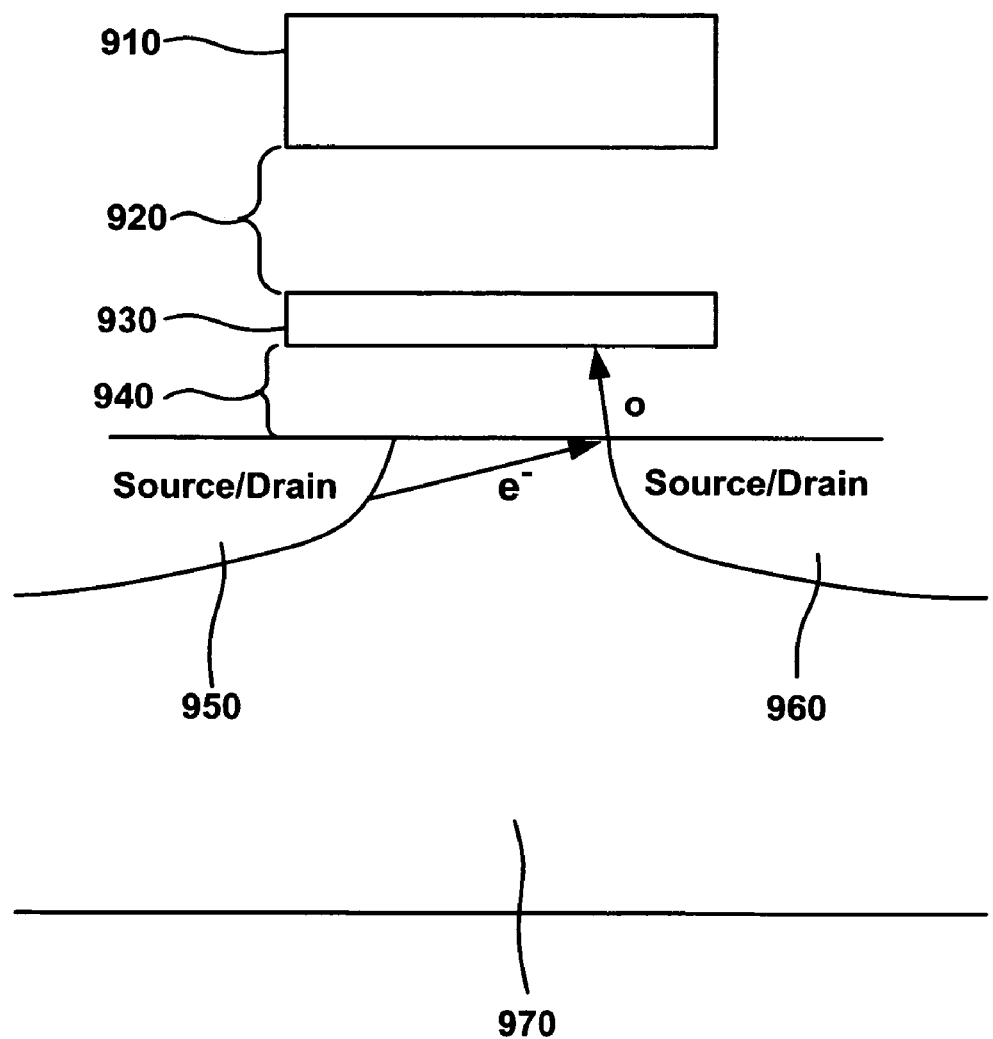
FIG. 9 is a block diagram illustrating a SSCHHI erasing scheme for dual bit flash memory cell including a tunnel oxide dielectric composed of homogenous oxynitride, in accordance with one embodiment of the present invention.

FIG. 9 is a block diagram illustrating a SSCHHI erasing scheme for dual, or mirrored, bit flash memory cell 900 including a tunnel oxide dielectric 940 composed of homogenous oxynitride, in accordance with one embodiment of the present invention. The dual bit flash memory cell 900 only comprises a single polysilicon layer. The dual bit flash memory cell 900 comprises a polysilicon control gate 910 over a interpoly dielectric 920, that is an oxide. A floating gate 930 comprising nitride separates the tunnel oxide dielectric 940 and the interpoly dielectric 920. The tunnel oxide dielectric 940 separates the floating gate 930 with a substrate 970. Regions 950 and 960 provide for source and drain regions depending on which side of the dual bit flash memory cell 900 is read or programmed.

The dual bit memory cell 900 holds twice as much data as conventional flash memory cells without compromising device endurance, performance or reliability. The doubling of storage capacity is achieved by the storage of two bits of data in one cell, without compromising data integrity. Specifically, two units of charge are stored individually, and in a different location within the dual bit memory cell 900. In one embodiment, the dual bit memory cell 900 stores individual units of charge on either side of the cell 900. As such, the left side of memory cell 900 located above source/drain 950 stores one unit of charge. Correspondingly, the right side of memory cell 900 located above source/drain 960 independently stores another unit of charge.

In this manner, the dual bit memory cell 900 is able to increase memory states from two to four. Instead of programming or reading between a 0 or 1, the dual bit memory cell 900 is able to independently program and read both the left and right sides of the memory cell 900, thus enabling four states, as follows: 00, 01, 10, and 11.

The erase scheme as illustrated in FIG. 9 is implemented by applying 4 to 6 volts on the source/drain region 960 (which is acting as a drain) to erase the right side of the dual bit flash memory device 900. The source/drain region 950 (which is acting as a source) is left floating. A voltage of 6 to 8 volts is applied to the control gate 910. Because of the band to band current generated between the source/drain regions 950 and 960, hole generation due to ionization impact in the source/drain region 960 causes valence electron to be generated and attracted to the floating gate 930 on the right side of the dual bit flash memory device 900. This neutralizes the electrons stored in the floating gate 930.

Alternatively, the voltage applied to the source/drain region 960 can be applied to the source/drain region 950 while leaving the source/drain region 960 to float in order to erase the left side of the dual bit flash memory device 900.

Exemplary Process

Figure 10:
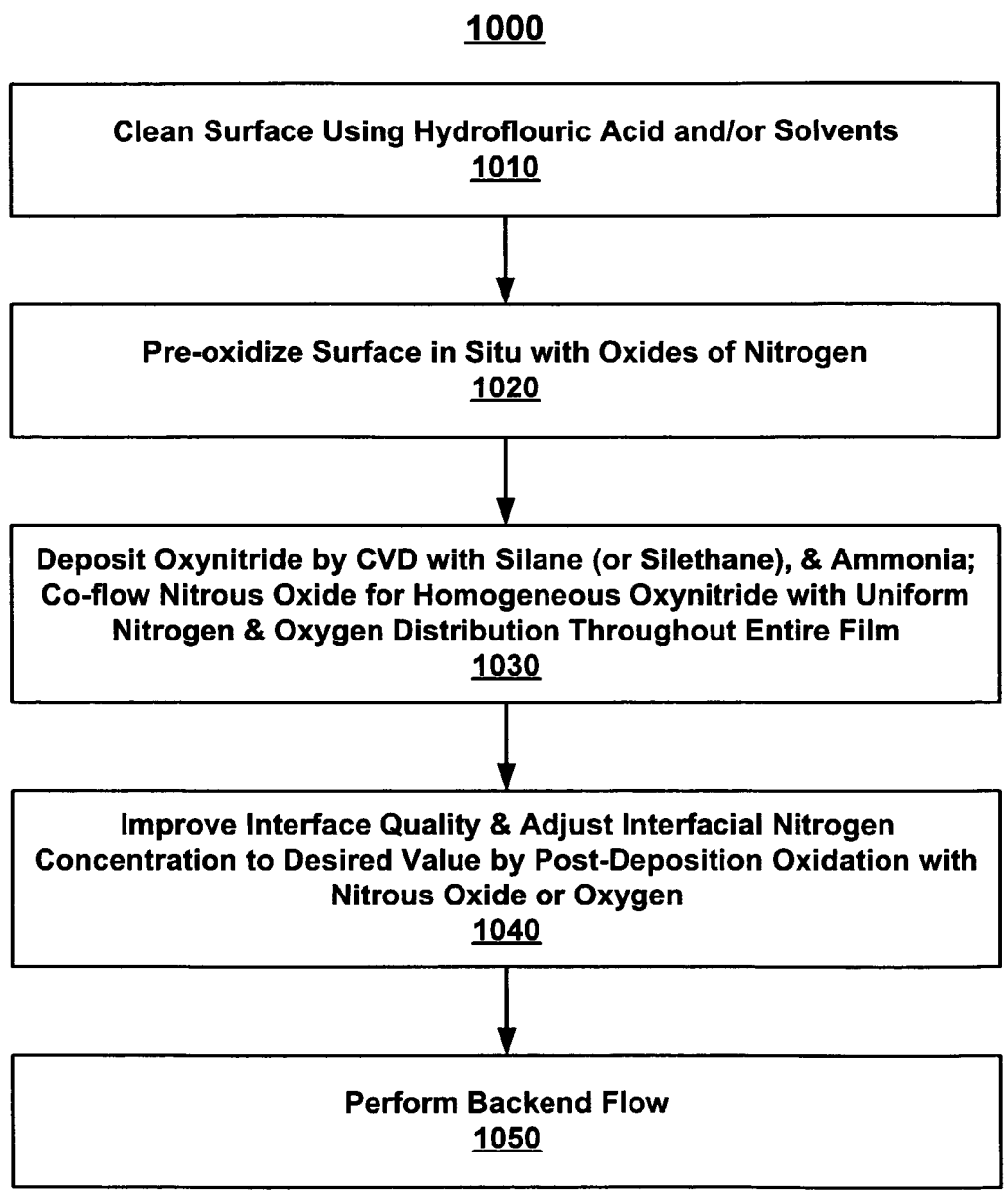
FIG. 10 is a flowchart of the steps in a process for producing a defect-free homogeneous oxynitride tunneling dielectric, according to an embodiment of the present invention.

Referring now to FIG. 10, a process 1000 is described for producing a defect-free homogeneous oxynitride tunneling dielectric for advanced flash memory devices. Process 1000 varies the oxygen content of a homogeneous oxynitride, which serves as a tunneling dielectric for the advanced flash memory devices described above. Advantageously, so varying the oxygen content of this oxynitride results in a tunneling dielectric with an increased dielectric constant, as well as a relatively low barrier height.

Process 100 begins with step 1010, wherein a substrate (e.g., substrate 370; FIG. 3) is cleaned. Cleaning, for the purposes of step 1010, is performed prior to oxidation of the substrate and can be effectuated by techniques well known in the art, such as the use of hydrogen fluoride, e.g., hydrofluoric acid (HF) or various solvents.

In step 1020, in situ pre-oxidation is conducted with oxides of nitrogen (NO and/or $NO_2$) at temperatures ranging from 800 to 1,100° C. This provides improved interface quality and a smooth, ultra-thin transitional layer of approximately 10 Å thickness.

In step 1030, oxynitride is deposited while adding nitrous oxide ($N_2O$). In one embodiment, the oxynitride is deposited by a chemical vapor deposition (CVD) process. In one embodiment, the $N_2O$ is added during the oxynitride deposition by introducing a co-flow of $N_2O$ into an otherwise conventional nitride deposition process with silane ($SiH_4$) and/or silethane ($Si_2H_6$), and ammonia ($NH_3$). The temperature at which this oxynitride deposition is conducted ranges from 650° C. to 950 C, in one embodiment. In one embodiment, the oxynitride deposition of step 1030 is performed using rapid thermal CVD (RTCVD) on apparatus such as is commercially available by Advanced Materials, Inc. of San Jose, Calif.

In one embodiment, the oxynitride deposition of step 1030 is performed using plasma enhanced CVD (PECVD) and/or low pressure CVD (LPCVD). In another embodiment, the oxynitride deposition of step 1030 is performed using a conventional furnace.

This produces a homogeneous oxynitride with uniform nitrogen and oxygen distributions throughout the film, advantageously increasing the dielectric constant and lowering the barrier height, which effectuates F-N and CHE tunneling.

In step 1040, post-oxynitride deposition oxidation is conducted with $N_2O$ and/or oxygen ($O_2$). This advantageously improves the quality of the interface and adjusts the interfacial nitrogen concentration to the desired value. Further, it anneals and condenses the film.

In step 1050, a backend flow is applied to further fabrication of the device according to techniques well known in the art, completing process 1000.

Figure 11:
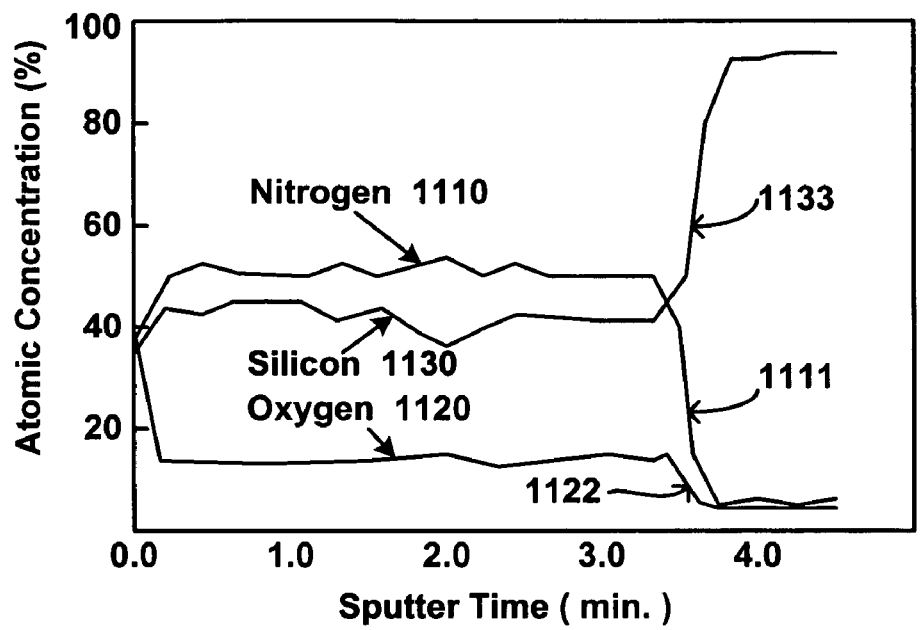
FIG. 11 are Fourier Transform infrared spectra showing relative atomic concentrations of silicon, nitrogen, and oxygen in a homogeneous oxynitride as a function of sputter time, according to an embodiment of the present invention.

Referring now to FIG. 11, Fourier Transform infrared (FTIR) spectra 1100 of the oxynitride film produced by process 1000 show a uniform distribution of nitrogen 1110, and a uniform distribution of oxygen 1120 throughout the film. Spectra 1100 reveal the atomic concentration in percent as a function of sputter time (e.g., sputtering according to step 1030 of process 1000; FIG. 10). The distribution of silicon 1130 is shown in juxtaposition with those of oxygen 1120 and nitrogen 1110. The sharp rise 1133 in the distribution of silicon and the concomitant drop-off in the distribution of oxygen 1122 and nitrogen 1111 show that the interface with the silicon substrate (e.g., substrate 370; FIG. 3) has been reached, thus revealing the depth of the oxynitride film (e.g., oxynitride 340; FIG. 3) as well as its homogeneity.

Figure 12:
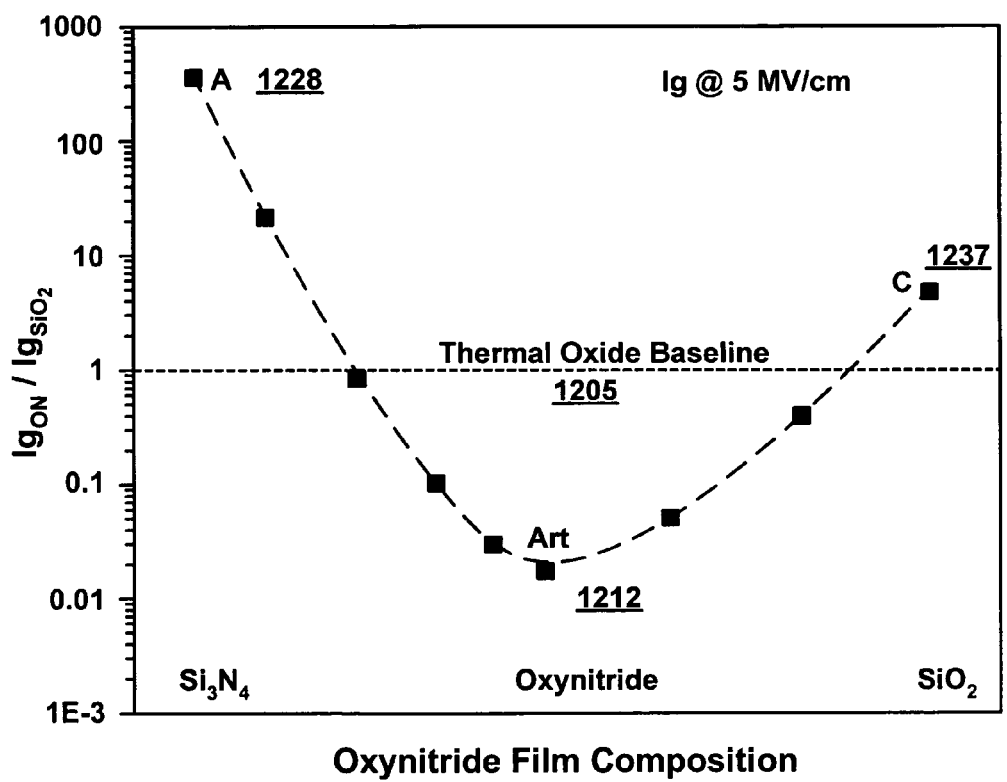
FIG. 12 depicts F-N Tunneling current density on thin oxynitride films of differing compositions, compared with thermal oxide of the same equivalent oxide thickness, according to an embodiment of the present invention.

With reference to FIG. 12, the F-N tunneling current density 1200 is displayed for thin oxynitride films with different compositions, in comparison with a baseline 1205 for thermal oxide of the same equivalent oxide thickness (EOT). The homogeneous oxynitride formed according to an embodiment of the present invention, such as by process 1000 (FIG. 10) has a lower leakage current 1212 then thermal oxide baseline 1205, that of pure silicon nitride ($Si_3N_4$) 1228, or pure silicon dioxide ($SiO_2$) 1237.

Figure 13:
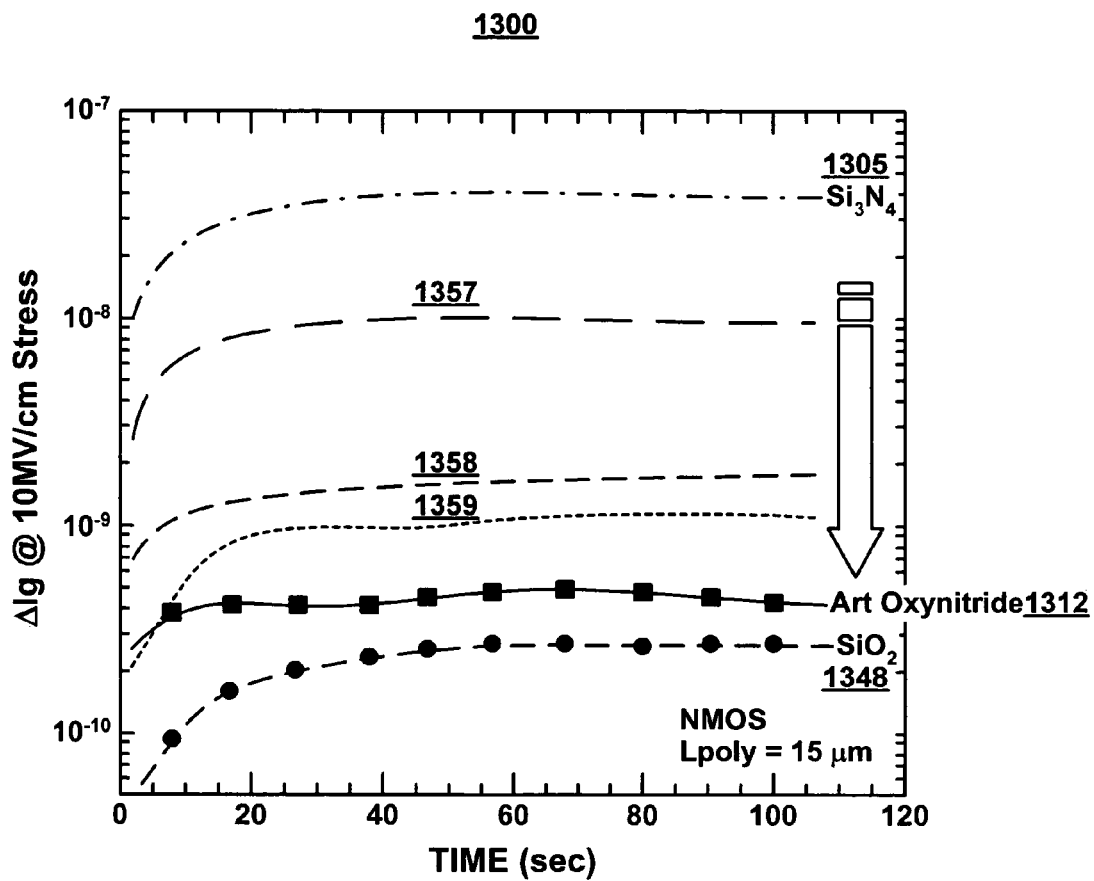
FIG. 13 depicts reduction in the defect density in a high quality oxynitride film, as produced by according to an embodiment of the present invention.

Now with reference to FIG. 13, a leakage current plot 1300 plots the leakage current from a voltage stress of zero to $10^{-7}$ Megavolts per centimeter as a function of time, from zero to 100 seconds for thin oxynitride films with different compositions. Lower leakage current, relative to that of pure nitride ($Si_3N_4$) 1305, is obtained from the homogeneous oxynitride produced according to an embodiment of the present invention, such as process 1000 (FIG. 10), as shown by leakage plot 1312.

The leakage current 1312 for the homogeneous oxynitride produced according to process 1000 is only slightly higher than the leakage current 1348 of pure $SiO_2$. This lower leakage current denotes a higher quality oxynitride, because a controlled amount of oxygen is introduced (e.g., step 1040 of process 1000; FIG. 10) into a high trapping nitride film. This oxygenation of the nitride film reduces the defect density to near state of the art oxide, which displays very low leakage current plot 1348.

Leakage currents 1357, 1358, and 1359 are plotted for oxynitride films of varying oxygen and nitrogen concentrations, different from that of the oxynitride produced by process 1000 (FIG. 10) as plotted by leakage current plot 1312. Of these intermediary oxynitrides, leakage current 1359 shows a lower defect density than leakage current 1358, which is lower than that displayed by leakage current 1357. The homogeneous oxynitride produced by an embodiment of the present invention (e.g., process 1000) shows the highest quality of the oxynitrides plotted, which is just slightly higher than the leakage current 1348 of pure $SiO_2$.

Kinetically, this improvement can result from the repair of dangling molecular bonds and release of excess hydrogen, accruing to the sufficiency of oxygen concentration in the nitride film. With the density of defects reduced to such low levels, the advantage of a higher dielectric constant for the oxynitride film can be realized. Advantageously, this results in a lowered tunneling current in the homogeneous oxynitride. The application of this homogeneous oxynitride is not limited to tunnel dielectric. The homogeneous oxynitride can also be successfully applied as gate oxide for ultra-thin gate logic devices, wherein the gate leakage current is reduced and device reliability is improved thereby.

An embodiment of the present invention, a method for producing a low defect homogeneous oxynitride, is thus described. While the present invention has been described in particular embodiments, it should be appreciated that the present invention should not be construed as limited by such embodiments, but rather construed according to the below claims.

What is claimed is:

1. A method for producing a low defect homogeneous oxynitride on a substrate, comprising:
   depositing an oxynitride layer above a substrate wherein said low defect homogeneous oxynitride comprises a tunneling dielectric having high capacitance and low barrier heights, wherein the dielectric constant corresponding to said oxynitride layer has a value within the range or 3.9 to 7.8, wherein the barrier height corresponding to said oxynitride layer has a value in the range of 3.2 to 2.1 electron Volts, wherein said depositing comprises one or more of an in-furnace process and a chemical vapor deposition process wherein said chemical vapor deposition process is selected from the group consisting essentially of rapid thermal chemical vapor deposition, plasma enhanced chemical vapor deposition, and low pressure chemical vapor deposition; and
   adding nitrous oxide with a mixture of gases selected from the group consisting essentially of silane, silethane, and ammonia during said depositing of said oxynitride, wherein said oxynitride on said substrate has uniform distributions of nitrogen and oxygen wherein said dielectric constant and said barrier height facilitates Fowler-Nordheim tunneling and Channel Hot Electron tunneling of electrons in said oxynitride layer, wherein said Channel Hot Electron tunneling allows source-side channel hot hole injection in a device comprised of said low defect homogeneous oxynitride on a substrate.

2. The method as recited in claim 1, further comprising:
   cleaning a surface of said substrate;
   oxidizing said surface of said substrate;
   improving the quality of an interface;
   adjusting the concentration of nitrogen in said interface; and
   performing a backend flow process.

3. The method as recited in claim 2 wherein said cleaning and said oxidizing are performed prior to said deposition.

4. The method as recited in claim 2 wherein said improving, said adjusting, and said performing are performed after said deposition.

5. The method as recited in claim 2 wherein said cleaning comprises application of a cleanser selected from the group consisting essentially of hydrogen fluoride and solvents.

6. The method as recited in claim 2 wherein said oxidizing comprises application of an oxide of nitrogen in situ.

7. The method as recited in claim 2 wherein said improving and said adjusting comprise oxidation.

8. The method as recited in claim 7 wherein said oxidation is performed by application of an oxidant selected from the group consisting essentially of an oxide of nitrogen and oxygen.

9. The method as recited in claim 1 wherein said low defect homogeneous oxynitride comprises a gate oxide for ultra-thin gate logic devices.

10. The method as recited in claim 1 wherein said homogeneous oxynitride is applied in a device selected from the group consisting essentially of a flash memory device and an ultra-thin gate logic device.

11. A method for producing a low defect homogeneous oxynitride on a substrate, comprising:
    cleaning a surface of said substrate;
    oxidizing a surface of said substrate;
    depositing an oxynitride layer above said substrate wherein said oxynitride layer comprises a tunneling dielectric having high capacitance and low barrier heights, wherein the dielectric constant corresponding to said oxynitride layer has a value within the range or 3.9 to 7.8, wherein the barrier height corresponding to said oxynitride layer has a value in the range of 3.2 to 2.1 electron Volts, and wherein said depositing comprises one or more of an in-furnace process and a chemical vapor deposition process wherein said chemical vapor deposition process is selected from the group consisting essentially of rapid thermal chemical vapor deposition, plasma enhanced chemical vapor deposition, and low pressure chemical vapor deposition;

improving the quality of an interface;

adjusting the concentration of nitrogen in said interface, wherein said oxynitride on said substrate has uniform distributions of nitrogen and oxygen wherein said dielectric constant and said barrier height facilitates Fowler-Nordheim tunneling and Channel Hot Electron tunneling of electrons in said oxynitride layer, wherein said Channel Hot Electron tunneling allows a source-side channel hot hole injection in a device comprised of said low defect homogeneous oxynitride on a substrate; and performing a backend flow process.

12. The method as recited in claim 11 wherein said cleaning comprises application of a cleanser selected from the group consisting essentially of hydrogen fluoride and solvents.

13. The method as recited in claim 11 wherein said oxidizing comprises application of an oxide of nitrogen in situ.

14. The method as recited in claim 11 wherein said improving and said adjusting comprise oxidation.

15. The method as recited in claim 14 wherein said oxidation is performed by application of an oxidant selected from the group consisting essentially of an oxide of nitrogen and oxygen.

16. The method as recited in claim 11 wherein said low defect homogeneous oxynitride comprises a gate oxide for ultra-thin gate logic devices.

17. The method as recited in claim 11 wherein said homogeneous oxynitride is applied in a device selected from the group consisting essentially of a flash memory device and an ultra-thin gate logic device.

* * * * *